US006939661B2

(12) United States Patent
Kang et al.

(10) Patent No.: US 6,939,661 B2
(45) Date of Patent: Sep. 6, 2005

(54) BLOCKED ISOCYANATE COMPOUND-CONTAINING COMPOSITION FOR FORMING A RADIATION ABSORBING COATING AND ANTI-REFLECTIVE COATING FORMED THEREFROM

(75) Inventors: Wen-Bing Kang, Shizuoka (JP); Ken Kimura, Shizuoka (JP); Shoko Matsuo, Shizuoka (JP); Yoshinori Nishiwaki, Shizuoka (JP); Hatsuyuki Tanaka, Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 286 days.

(21) Appl. No.: 10/232,081

(22) Filed: Aug. 30, 2002

(65) Prior Publication Data

US 2003/0027078 A1 Feb. 6, 2003

Related U.S. Application Data

(63) Continuation of application No. 09/486,843, filed on May 23, 2000, now Pat. No. 6,465,148.

(30) Foreign Application Priority Data

Jul. 3, 1998 (JP) ............................................ 10/188380
Jun. 23, 1999 (JP) ................................. PCT/JP99/03332

(51) Int. Cl.$^7$ .............................................. G03F 7/004
(52) U.S. Cl. ................................ 430/270.1; 430/284.1; 430/905
(58) Field of Search ........................... 430/270.1, 284.1, 430/905

(56) References Cited

U.S. PATENT DOCUMENTS

| | | | |
|---|---|---|---|
| 2,751,373 A | 6/1956 | Unruh et al. ............... 260/78.5 |
| 2,811,509 A | 11/1957 | Smith et al. ................... 260/63 |
| 3,854,946 A | 12/1974 | Sayigh et al. ................ 96/35.1 |
| 4,609,614 A | 9/1986 | Pampalone et al. ......... 430/323 |
| 4,882,260 A | 11/1989 | Kohara et al. ............... 430/191 |
| 4,910,122 A | 3/1990 | Arnold et al. ............... 430/313 |
| 4,996,282 A | 2/1991 | Noren |
| 5,057,399 A | 10/1991 | Flaim et al. ................. 430/313 |
| 5,110,697 A | 5/1992 | Lamb, III et al. ............ 430/14 |
| 5,234,990 A | 8/1993 | Flaim et al. ................. 524/609 |
| 5,364,738 A | * 11/1994 | Kondo et al. ................ 430/283 |
| 5,554,485 A | 9/1996 | Dicniara et al. .......... 430/271.1 |

FOREIGN PATENT DOCUMENTS

| | | |
|---|---|---|
| EP | 0 542 008 | 5/1993 |
| EP | 0 861 855 | 9/1998 |
| JP | 1-224747 | * 9/1989 |
| JP | 01242614 A | * 9/1989 |
| WO | WO 94/12912 | 6/1994 |
| WO | WO 97/07145 | 2/1997 |
| WO | WO 98/12238 | 3/1998 |

OTHER PUBLICATIONS

Derwent Abstract 1990–002333 for JP 01242614 A, Sep. 1989.*
Derwent abstract of JP 1–224747, Sep. 1989.*
Chemical Abstract DN 112:243085, JP 1–224747, Sep. 1989, abstract.*
English abstract for JP 06–012452, Jan. 21, 1994, Fujicka et al.
English abstract for JP 06–064338, Mar. 8, 1994, Maehashi, et al.
English abstract for JP 06–075378, Mar. 18, 1994, Knors, et al.
English abstract for JP 06–118656, Apr. 28, 1994, Nemoto, et al.
English abstract for JP 06–313968, Nov. 8, 1994, Arnold, et al.
English abstract for JP 07/082221, Mar. 28, 1995, Urano, et al.
English abstract for JP 09–146800, Jun. 6, 1997, Nishida, et al.
English abstract for JP 10–048834, Feb. 20, 1998, Mizutani, et al.
English abstract for JP 10–066626, Mar. 10, 1998, Nakamura.
G. Czech, et al., "Reduction of Linewidth variation for the gate conductor level", Microelectric Engineering 21 1993) pp. 51–56.
C. Nolscher, et al., "High contrast single layer resists and antireflection layers—an alternative to multilayer resist techniques", SPIE, vol. 1086, Advances in Resist Technology and Processing VI (1989), pp. 242–250.
K. Bather, et al., "TiNxOy as a barrier between Cr–Si–(o) and aluminum thin films", Thin Solid Films, 200 (1991) pp. 93–116.

* cited by examiner

Primary Examiner—Rosemary Ashton
(74) Attorney, Agent, or Firm—Alan P. Kass

(57) ABSTRACT

A composition for forming a radiation absorbing coating which comprises an organic solvent, a radiation absorbing polymer or a radiation absorbing material dissolved therein and a crosslinking agent having blocked isocyanate groups. Since the isocyanate groups of the crosslinking agent have been blocked, the composition containing the crosslinking agent has excellent storage stability. When the composition applied to a substrate and then baked, crosslinking proceeds to give an antireflective coating, which does not intermix with a resist layer to be formed thereon by coating and is free from diffusion of a photo-generated acid thereinto from the resist layer. As a result, a resist image free from footing or scum can be formed.

2 Claims, No Drawings

BLOCKED ISOCYANATE COMPOUND-CONTAINING COMPOSITION FOR FORMING A RADIATION ABSORBING COATING AND ANTI-REFLECTIVE COATING FORMED THEREFROM

The application is a continuation application of Ser. No. 09/468,843 filed May 23, 2000, now U.S. Pat. No. 6,465,148.

TECHNICAL FIELD

This invention relates to a novel composition for forming a radiation absorbing coating and a radiation absorbing coating formed therefrom such as an anti-reflective coating. More particularly, it relates to a composition for forming a radiation absorbing coating which is particularly suited for forming an anti-reflective coating capable of effectively preventing reflection from a substrate of radiation to be used in manufacturing super-fine elements such as integrated circuit elements according to photolithography method and to a radiation absorbing coating such as an anti-reflective coating formed therefrom.

BACKGROUND ART

In the field of manufacturing integrated circuits, miniaturization of processing size in the lithography process has continuously proceeded in order to attain higher integration degree and, in recent years, technology enabling such fine processing of the order of sub-micron has been being developed. In such lithography process, a resist composition is coated on a substrate. The coating is then exposed using an exposure apparatus through a mask pattern to create a latent image of the mask pattern, and the latent image is developed using a proper developing solution to obtain a desired resist pattern. However, many of such substrates used have such a high reflectivity that, particularly when substrates with uneven surface are used, an exposure radiation having passed through the resist layer is reflected by the substrate to the resist layer again, thus problems of reflection notching, standing wave or dimensional unevenness of resulting resist pattern being caused.

In order to solve the problems, various methods have so far been investigated. For example, there are illustrated a method of dispersing or dissolving in the photoresist a dye having absorption at the wavelengths of exposure radiation (U.S. Pat. No. 4,882,260) and a method of absorbing exposure radiation having reached to the substrate by an anti-reflective layer formed on the substrate. As the latter method of forming an anti-reflective layer on the substrate, there have been known a method of forming an inorganic compound layer on a substrate by vacuum deposition, CVD method or the like (C. Nolscher, et al., Proc. SIPE, 1086, p. 242 (1989); K. Bather, et al., Thin Solid Films, 200, p. 93 (1991); and G. Czech, et al., Microelectronic Engineering, 21, p. 51 (1993)), a method of coating an organic polymer solution containing dissolved or dispersed therein a dye, a method of forming an anti-reflective layer by using a polymer dye wherein chromophores are chemically bonded to a polymer or using a polymer which itself has radiation absorbing property, and like method. These methods of using radiation absorbing polymers and radiation absorbing polymer materials for the methods are described in, for example, Japanese Unexamined Patent Publication Nos. H6-75378 and H6-118656, WO 9412912, U.S. Pat. Nos. 4,910,122 and 5,057,399, etc.

In forming the above-described organic anti-reflective coating, a photoresist-coating apparatus is often employed also as an apparatus for applying the anti-reflective coating composition. It is also desired in view of managing waste liquor that a solvent to be used for the anti-reflective coating composition be the same as that for the photoresist composition. However, in the case of forming the anti-reflective coating and the resist layer by using mutually the same solvent, intermixing between the anti-reflective coating and the resist layer is liable to take place upon applying a resist composition onto the anti-reflective coating already formed. In order to prevent this intermixing, it is necessary to introduce thermally cross-linkable properties into the anti-reflective coating. However, with some kinds of cross-linking agents to be used, the resist layer is adversely affected by the anti-reflective coating material containing the cross-linking agent to suffer footing or generation of scum, deformation of resist image, etc., thus failing to form a resist image with desired resolution and shape. In particular, where chemically amplified resists adapted for exposure radiation sources such as KrF excimer laser are used, the resists are liable to be adversely affected by the properties of anti-reflective coating, in particular, by acidic degree. Thus, improvement of the anti-reflective coating has been desired. In addition, in some cases, shape of resist pattern is changed in the interface between the resist and the anti-reflective coating depending upon the properties of the anti-reflective coating itself such as acidic degree. That is, with alkaline anti-reflective coating, tailing of a resist pattern is observed, whereas with acidic anti-reflective coating, resist pattern having undercut structure is formed. Thus, there has been desired an anti-reflective coating exerting less influences on a resist pattern.

An object of the present invention is to provide a coating composition which shows high anti-reflective properties, causes no intermixing upon applying thereon a resist, and causes no adverse influences on the shape of resist pattern and a method for forming a resist pattern using an anti-reflective coating having a proper acidic degree.

DISCLOSURE OF THE INVENTION

As a result of intensive investigations, the inventors have found that an anti-reflective coating having no conventional defects can be formed by incorporating in the composition for forming an anti-reflective coating a compound having two or more blocked isocyanate groups as a cross-linking agent, thus having achieved the present invention based on the founding.

That is, the present invention relates to a composition for forming a radiation absorbing coating which contains at least a radiation absorbing material and a compound having two or more blocked isocyanate groups.

In addition, the present invention relates to a radiation absorbing coating and an anti-reflective coating formed by using this composition for forming a radiation absorbing coating.

The present invention will be described in more detail below.

In the composition of the present invention for forming radiation absorbing coating, a compound having two or more blocked isocyanate groups is used which functions as a cross-linking agent. As the compound having two or more blocked isocyanate groups, compounds of the following (1) to (3) are particularly preferred:

(1) compounds represented by the following general formula (I) and having bis-isocyanate groups blocked with one of alcohols, phenols or oxime compounds:

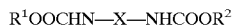

$$R^1OOCHN-X-NHCOOR^2 \quad (I)$$

wherein X represents a straight-chain or branched alkylene group containing 1 to 30 carbon atoms, a divalent alicyclic hydrocarbon group containing 3 to 30 carbon atoms or a divalent aromatic ring group containing 4 to 30 carbon atoms, and $R^1$ and $R^2$ each independently represents an alkyl group containing 1 to 20 carbon atoms, an aromatic ring group containing 4 to 30 carbon atoms or an organic group having an imino group and containing 3 to 20 carbon atoms;

(2) polymers represented by the following general formula (II) and containing a recurrent unit having in a side chain an isocyanate group blocked with one of alcohols, phenols or oxime compounds:

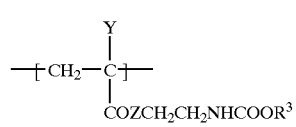

(II)

wherein Y represents a hydrogen atom, an alkyl group containing 1 to 3 alkyl group or a halogen atom, Z represents an oxygen atom or NH, and $R^3$ represents an alkyl group containing 1 to 20 carbon atoms, an aromatic ring group containing 4 to 30 carbon atoms or an organic group having an imino group and containing 3 to 20 carbon atoms; and (3) condensation polymers between formaldehyde and phenyl isocyanate represented by the following general formula (III) and having an isocyanate group blocked with one of alcohols, phenols or oxime compounds:

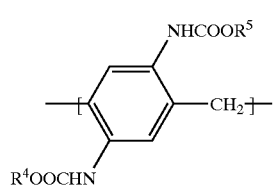

(III)

wherein $R^4$ and $R^5$ each independently represents an alkyl group containing 1 to 20 carbon atoms, an aromatic ring group containing 4 to 30 carbon atoms or an organic group having an imino group and containing 3 to 20 carbon atoms.

Additionally, in the above general formulae (I) to (III), the aromatic ring group includes a heteroaromatic ring group.

The compounds represented by the above general formulae (I) to (III) will be described more specifically below.

First, the compounds represented by the general formula (I) and having blocked bis-isocyanate groups can be prepared by reacting a corresponding bis-isocyanate compound with a desired blocking agent. As the bis-isocyanate compounds, there may be specifically illustrated such bis-isocyanate compounds as hexamethylenediisocyanate, 1,4-cyclohexanediisocyanate, toluenediisocyanate, bisisocyanatomethylcyclohexane, bisisocyanatomethylbenzene, bisisocyanatomethylethylbenzene, ethylenediisocyanate, etc.

As preferable examples of the alcohols to be used as the blocking agent, there are illustrated methanol, ethanol, propanol, butanol, ethylene glycol, methyl cellosolve, butyl cellosolve, methyl carbitol, benzyl alcohol, phenyl cellosolve, furfuryl alcohol, cyclohexanol, naphthyl alcohol, anthracene methanol, 4-nitrobenzyl alcohol, etc. Preferable examples of the phenols include phenol, substituted phenols such as cresol, xylenol, p-ethylphenol, o-isopropylphenol, p-tert-butylphenol, p-tert-octylphenol, thymol, p-nitrophenol, p-chlorophenol, etc., naphthol, etc., and preferable examples of the oxime compound include formaldoxime, acetaldoxime, acetoxime, 2-butanoneoxime, acetophenoneoxime, methyl ethyl ketoxime, 2,3-butanedioneoxime, cyclohexanoneoxime, diphenylglyoxime, benzaldehydoxime, etc. Of these, butanol, benzyl alcohol, 2-butanoneoxime, acetoxime, phenol, etc. are particularly preferred. However, the blocking agents are not limited only to these specifically illustrated ones.

The bis-isocyanate compounds blocked with these blocking agents undergo deblocking reaction at a temperature specific to each blocking agent to produce a highly reactive isocyanate group, thus cross-linking reaction proceeding. Additionally, mechanism of blocking with the blocking agent and deblocking thereof, the blocking agents, and bis-isocyanate cross-linking materials are described in, for example, "Kakyozai Handbook" (compiled by Sinzo Yamasita and published by Taiseisha in 1990), p. 232–242. As the blocking agents (alcohols, phenols, and oxime compounds) or bis-isocyanate compounds used in the present invention, any of these known ones may be used.

The polymer containing a recurrent unit represented by the general formula (II) can be prepared by reacting an isocyanate group-containing polymer with the blocking agent of an alcohol, a phenol or an oxime compound. The isocyanate group-containing polymer may be a homopolymer or a copolymer additionally having other recurrent unit. The polymer having a recurrent unit represented by the general formula (II) may also be prepared by polymerizing the isocyanate group-containing monomer having previously been blocked with a blocking agent or by copolymerizing, if necessary, the blocked monomer with other monomer.

As the other monomer utilizable for forming the copolymer, any of known vinyl monomers may fundamentally be used that does not adversely influences cross-linking properties of the blocked isocyanate group. Preferred monomers include, for example, acrylic acid; methacrylic acid; acrylic esters such as methyl acrylate, ethyl acrylate, propyl acrylate, butyl acrylate, etc.; methacrylic esters such as methyl methacrylate, ethyl methacrylate, propyl methacrylate, butyl methacrylate, etc.; styrene; alkyl vinyl ethers such as methyl vinyl ether, ethyl vinyl ether, propyl vinyl ether, butyl vinyl ether, etc.; and the like. Of these copolymerizable monomers, acrylic esters and methacrylic esters are particularly preferred. The amount of the blocked isocyanate group in the copolymer may be not less than the amount necessary for completing the cross-linking. Kind and amount of the other comonomer may be selected depending upon the requirements for coating properties, stability, solubility, etc.

Average molecular weight of the polymer to be used in the present invention having a recurrent unit represented by the general formula (II) is generally 1,000–500,000, preferably 1,000–100,000.

As the blocking agent to be used for forming the polymer having a recurrent unit represented by the general formula (II), any of the alcohols, phenols and oxime compounds used for forming the compound of the above general formula (I) may be used.

The condensation polymer represented by the general formula (III) can be prepared by blocking the isocyanate group-containing condensation polymer with the same blocking agent as described above. In this case, the oxime compounds are preferable as the blocking agents. Average molecular weight of the condensation polymer is generally 500–500,000, preferably 1,000–10,000.

Next, as the radiation absorbing material to be used in the composition of the present invention for forming a radiation absorbing coating, any of those that can absorb radiation at exposure wavelength to be used upon exposure of a photoresist may be used. As such radiation absorbing materials, there may preferably be used, for example, dyes conventionally known as radiation absorbing materials for formation of an anti-reflective coating, polymers having in a side chain a radiation absorbing group, polymers having a radiation absorbing group in a main chain, and the like. Specific examples of these radiation absorbing materials are found in, for example, U.S. Pat. Nos. 2,751,373, 2,811,509,3,854, 946, 4,609,614, 4,910,122, 5,057,399,5,110,697 and 5,234, 990, Japanese Examined Patent Publication Nos. H6-12452 and H6-64338, EP Patent 542008, U.S. Pat. No. 5,554,485, Japanese Unexamined Patent Publication Nos. H6-75378, H6-118656, H6-313968 and H7-82221, WO 97/07145, Japanese Unexamined Patent Publication No. H10-48834, WO 98/12238, Japanese Patent Application No. H9-146800, PCT/JP98/02234 and Japanese Patent Application No. H10-66626.

As the radiation absorbing material, those polymers and the composition thereof suffice which have enough absorption of radiation at exposure wavelength to be used as an anti-reflective coating. Preferable examples thereof include copolymers between a vinyl monomer having an aromatic ring such as a benzene ring, naphthalene ring, anthracene ring or the like in a side chain and a (meth)acrylic ester. As the specific examples thereof, there are illustrated copolymers represented by the following formulae (IV)–(VI) (wherein only copolymer components are shown). The copolymers may be ones containing (meth)acrylic ester monomers having a reactive functional group such as those of the formula (IV) or (VI), or may be copolymers containing (meth)acrylic ester monomer having a stable ester group such as those of the formula (V). With the former copolymers, the reactive functional group reacts with the aforesaid cross-linking agent having a blocked isocyanate group to form a cross-linking structure. And, with the latter copolymers, they do not react with the radiation absorbing material but the cross-linking compound molecules react with each other to cause self cross-linking and form a strong coating.

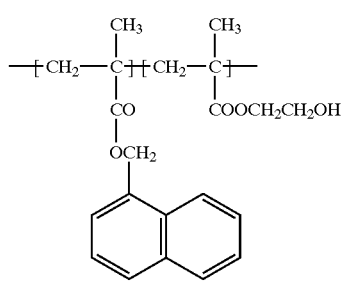

(IV)

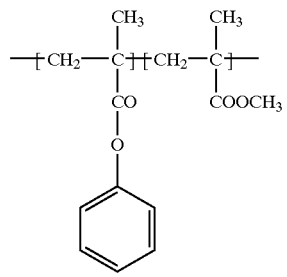

(V)

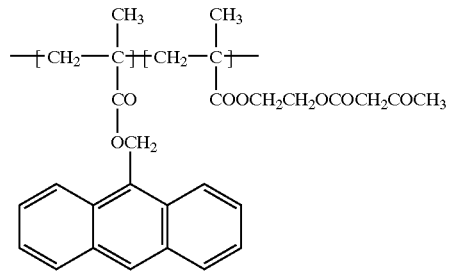

(VI)

However, as has been described hereinbefore, the radiation absorbing material to be used in the composition of the present invention for forming the radiation absorbing coating is not limited only to these specifically disclosed ones.

A proper film-forming resin may be added in order to improve film-forming properties of the composition for forming radiation absorbing coating, regardless of whether the radiation absorbing material and the isocyanate-containing compound to be used in the composition of the present invention for forming radiation absorbing coating have no film-forming properties or the radiation absorbing material have film-forming properties. As such resins, there may be illustrated those main-chain type polymers which have conventionally been used as base polymers for resist, such as novolak resin, hydroxystyrene-containing polymer, polyimide or the like. In this case, the polymers themselves may not have a substituent capable of reacting with an isocyanate group. When such polymers are used, insolubilization of the coating is attained by cross-linking between the blocked isocyanate compound molecules with each other or between the blocked isocyanate compound and the radiation absorbing material. Furthermore, cross-linking density may properly be adjusted by adding a low-molecular compound or a high-molecular compound having a substituent or substituents capable of reacting with isocyanate group such as hydroxyl group. As such compounds, there may be illustrated polyhydroxystyrene, novolak, hydroxyethyl methacrylate, bifunctional alcohol or an oligomer or polymer having carboxyl group.

In the composition of the present invention for forming a radiation absorbing coating, a solvent is used which can dissolve or disperse all components in the composition. As the solvent, any one that can dissolve or disperse each of the components in the composition may be used. Examples of such solvent include γ-butyrolactone, cyclohexanone, dimethylacetamide, dimethylformamide, dimethylsulfoxide, N-methylpyrrolidone, ethyl lactate (hereinafter abbreviated as "EL"), methoxypropanol (hereinafter abbreviated as "PGME"), propylene glycol monomethyl ether acetate (hereinafter abbreviated as "PGMEA") and the mixtures thereof. These examples are not intended to limit the solvent used in the present invention. Of the above-described solvent, γ-butyrolactone, cyclohexanone, EL, PGME, PGMEA and a mixture of PGME and PGMEA are particularly preferred.

In addition, to the composition for forming a radiation absorbing coating may be added a heat- or photo-acid generating agent, an aliphatic or aromatic sulfonic acid or a salt thereof with, for example, an amine. The heat- or photo-acid generators are those which are generally used in coatings, photoresists or the like. As the sulfonic acid, there are illustrated methanesulfonic acid, propanesulfonic acid, fluorine-containing alkylsulfonic acid, benzenesulfonic acid, toluenesulfonic acid, dodecylbenzenesulfonic acid, phenolsulfonic acid and naphthalenesulfonic acid. As the salt-forming amine, triethylamine, aminoethanol, diaminoethanol, ethylamine, propylamine, butylamine, benzylamine, etc. may be used.

In order to more strengthen cross-linking, there may be added generally used cross-linking agents such as melamine derivatives such as hexamethoxymethyl melamine, ethylene urea derivatives including ethylene urea, epoxy group-containing compounds, etc. Further, in order to adjust adhesion properties to a substrate and coating properties, there may be added known additives having conventionally been used upon formation of a radiation absorbing coating (e.g., anti-reflective coating) such as a surface active agent, a silane leveling agent, etc.

Additionally, although components of the composition for forming a radiation absorbing coating have been individually explained, the composition of the present invention may of course be that which is obtained by adding the blocked isocyanate group-containing compound of the present invention to a conventionally known composition for forming an anti-reflective coating (containing or not containing a cross-linking agent) not containing the blocked isocyanate group-containing compound, whereby properties of conventionally known anti-reflective coating can be improved.

The composition of the present invention for forming a radiation absorbing coating is applied on a substrate in a dry thickness of, for example, 300–5000 Å according to a conventionally known method such as spin coating, roller coating, dip coating or cast coating, and was baked on a hot plate or in an oven to evaporate the solvent and cause cross-linking, thus the coating being made insoluble for a solvent of a coating composition to be applied thereon. The baking temperature is generally 70–260° C.

A photoresist composition is usually applied on the radiation absorbing coating such as an anti-reflective coating formed from the composition of the present invention for forming a radiation absorbing composition, thus a photoresist layer being formed. As the photoresist to be applied onto the radiation absorbing coating of the present invention, any of conventionally known positive-working or negative-working photoresists may be used. Typical examples of usable photoresists include a positive-working resist comprising a novolak resin and a quinonediazide photo-sensitive agent, a chemically amplified positive- or negative-working resist, a negative-working resist containing photo-sensitive double bond or of azide type. However, photoresists to be applied on the radiation absorbing coating of the present invention are not limited only to these illustrated ones. Further, needless to say, the coating to be formed on the radiation absorbing coating is not limited only to the resist layer.

The composition of the present invention for forming a radiation absorbing coating is particularly useful for forming a bottom anti-reflective coating upon manufacturing integrated circuits. In addition to the anti-reflective coating, the composition may be useful for forming an isolation layer for preventing mutual action between a resist and a substrate. Further, with stepped substrate, uneven surface can be flattened by applying the anti-reflective coating, thus the coating may function as a leveling layer. As a result, coating uniformity of the resist can be so improved on a stepped substrate on which the anti-reflective coating has been formed that fluctuation in pattern dimension can be suppressed.

BEST MODE FOR PRACTICING THE INVENTION

The present invention will be described more specifically by reference to Examples which, however, are intended to merely illustrate the present invention and are not construed to limit the present invention in any way.

EXAMPLE 1

Synthesis of Blocked Isocyanate Group-Containing Polymer 1

38.3g (0.44 mol) of 2-butanoneoxime was mixed with 550 g of tetrahydrofuran at room temperature to prepare a uniform solution. To this solution was dropwise added 62 g (0.4 mol) of 2-isocyanatoethyl methacrylate under stirring and, after stirring the mixture for 3 hours at room temperature, a solution of 40 g (0.4 mol) of methyl methacrylate in 100 g of tetrahydrofuran and 4.6 g of azobisisobutyronitrile (AIBN, initiator) were added thereto. After stirring the solution for 20 minutes under a nitrogen stream, polymerization was conducted at 65° C. for 7 hours. After completion of the reaction, the reaction solution was cooled to room temperature and subjected to precipitation from hexane. The white powdery product thus produced was filtered out, washed with hexane, and vacuum dried to obtain 110 g of a polymer containing isocyanate groups blocked with 2-butanoneoxime. GPC analysis using tetrahydrofuran as a mobile phase and using polystyrene as a standard substance revealed that weight average molecular weight Mw, number average molecular weight Mn, degree of dispersion Mw/Mn of the thus obtained polymer were 35,000, 13,400 and 2.61, respectively.

EXAMPLE 2

Synthesis of Blocked Isocyanate-Containing Polymer 2

38.3g (0.44 mol) of 2-butanoneoxime was mixed with 550 g of tetrahydrofuran at room temperature to prepare a uniform solution. To this solution was dropwise added 62 g (0.4 mol) of 2-isocyanatoethyl methacrylate under stirring and, after stirring the mixture for 3 hours at room temperature, a solution of 70.4 g (0.4 mol) of benzyl methacrylate in 150 g of tetrahydrofuran and 4.6 g of AIBN were added thereto. After stirring the solution for 20 minutes under a nitrogen stream, polymerization was conducted at 65° C. for 8 hours. After completion of the reaction, the reaction solution was cooled to room temperature and subjected to precipitation from hexane. The white powdery product thus produced was filtered out, washed with hexane, and vacuum dried to obtain 120 g of a polymer containing isocyanate groups blocked with 2-butanoneoxime. GPC analysis using tetrahydrofuran as a mobile phase and using polystyrene as a standard substance revealed that weight average molecular weight Mw, number average molecular weight Mn, degree of dispersion Mw/Mn of the thus obtained polymer were 32,000, 12,800 and 2.5, respectively.

EXAMPLE 3

Synthesis of Blocked Isocyanate-Containing Polymer 3

To a solution obtained by dissolving 55.5g of 2-butanoneoxime in 145 g of propylene glycol methyl ether acetate (PGMEA) at room temperature was added 50 g of a polycondensation resin of phenyldiisocyanate and formaldehyde marketed by Aldrich Co., followed by stirring for longer than 10 hours to obtain a solution of a polymer wherein isocyanate groups were blocked. PGMEA was added to this reaction solution in such amount that concentration of said polycondensation resin became 10 wt %. This solution was used below as a solution for preparing the composition for forming an anti-reflective coating.

EXAMPLE 4

Preparation of Anti-Reflective Coating Composition 1

10 g of the copolymer represented by the following formula (VI)(wherein only copolymerization components are shown) was dissolved in 300 g of PGMEA. To this solution was added 20 g of a 10 wt % solution of the polymer synthesized in the above Example 1 and, after stirring for 3 hours at room temperature, the reaction solution was press-filtered using in order filters of 1 micron, 0.5 micron, 0.2 micron, 0.1 micron and 0.05 micron made by Milipore Co. The thus obtained filtrate was used for evaluation of resists and for conducting other experiments described hereinafter.

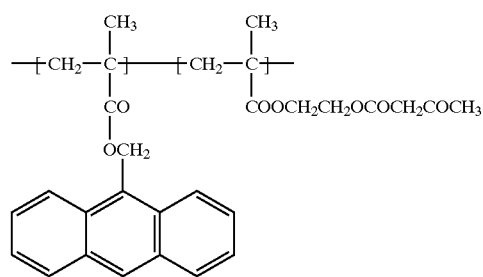

(VI)

EXAMPLE 5

Preparation of Anti-Reflective Coating Composition 2

10 g of the copolymer represented by the following formula (VII)(wherein only copolymerization components are shown) was dissolved in 300 g of PGMEA. To this solution was added 20 g of a 10 wt % solution of the polymer synthesized in the above Example 1 and, after stirring for 3 hours at room temperature, the reaction solution was press-filtered using in order filters of 1 micron, 0.5 micron, 0.2 micron, 0.1 micron and 0.05 micron made by Milipore Co. The thus obtained filtrate was used for evaluation of resists and for conducting other experiments described hereinafter.

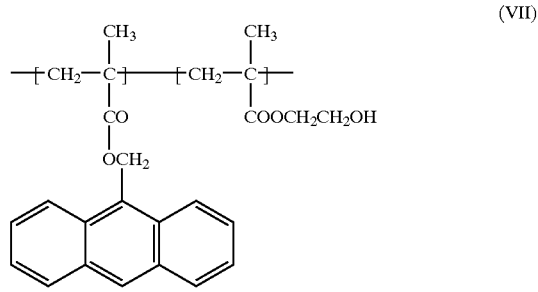

(VII)

EXAMPLE 6

Preparation of Anti-Reflective Coating Composition 3

10 g of the copolymer represented by the above formula (VII) was dissolved in 300 g of PGMEA. To this solution was added 20 g of a 10 wt % solution of the polymer synthesized in the above Example 2 and, after stirring for 1 hour at room temperature, 1 g of hexamethoxymethylmelamine and 0.1 g of a salt of p-dodecylbenzenesulfonic acid and dimethylaminoethanol. After stirring the mixture for 3 hours, the reaction solution was press-filtered using in order filters of 1 micron, 0.5 micron, 0.2 micron, 0.1 micron and 0.05 micron made by Milipore Co. The thus obtained filtrate was used for evaluation of resists and for conducting other experiments described hereinafter.

EXAMPLE 7

Preparation of Anti-Reflective Coating Composition 4

To a solution of AZ KrF-2 (made by Clariant Co.) for forming an anti-reflective coating adapted for deep UV (DUV) radiation was added 20g (20 wt % based on solid components of AZ® KrF-2) of a 10 wt % solution of the polymer synthesized in the above Example 1 and, after stirring for 3 hours at room temperature, the reaction solution was press-filtered using in order filters of 1 micron, 0.5 micron, 0.2 micron, 0.1 micron and 0.05 micron made by Milipore Co. The thus obtained filtrate was used for evaluation of resists and for conducting other experiments described hereinafter.

EXAMPLE 8

Preparation of Anti-Reflective Coating Composition 5

10 g of the copolymer containing anthracene side chain and used in Example 4 was dissolved in 300 g of PGMEA. To this solution was added 20 g of a 10 wt % solution of the polymer synthesized in the above Example 3 and, after stirring for 3 hours at room temperature, the solution was press-filtered using in order filters of 1 micron, 0.5 micron, 0.2 micron, 0.1 micron and 0.05 micron made by Milipore Co. The thus obtained filtrate was used for evaluation of resists and for conducting other experiments described hereinafter.

EXAMPLE 9

Solubility Experiment of Coating Obtained from the Anti-Reflective Coating Composition 1

The above-described composition 1 was coated on a silicon wafer and, after being baked on a hot plate, a resist solvent of propylene glycol methyl ether acetate (PGMEA) and a developer, 2.38 wt % solution of tetramethylammonium hydroxide (TMAH) were respectively dropped on the baked coating and, after 60 seconds, the solution on the coating was wiped off to determine reduction of the coating. The results thus obtained are tabulated below.

It is seen from the experiment results that, when the crosslinkable polymer of the present invention containing a blocked isocyanate group is used, the coating itself is completely dissolved in a solvent such as PGMEA before baked or after baked at lower temperatures, and hence the coating can afford edge rinsing and back rinsing of a silicon wafer with the resist solvent, and that the coating suffers no reduction after baked at proper temperatures and undergoes no dissolution in the subsequent coating of a resist composition. It is also seen that the anti-reflective coating itself does not change upon development. It is further seen that, since the coating is not cured unless baking is conducted at a comparatively high temperature (120° C. or higher), the composition is quite stable.

TABLE

Elution Experiment of Anti-reflective coating

| | Reduction of coating thickness by PGMEA | Reduction of coating thickness by TMAH |
|---|---|---|
| 120° C. 60 seconds | 100% | not reduced |
| 140° C. 60 seconds | 82% | not reduced |
| 160° C. 60 seconds | 51% | not reduced |
| 180° C. 60 seconds | not reduced | not reduced |
| 200° C. 60 seconds | not reduced | not reduced |

EXAMPLE 10

Experiment on Resist Pattern

Each of the solutions of the present invention described in Examples 4–8 for forming an anti-reflective coating was coated on a silicon wafer in a thickness of 60 nanometers after being baked for 60 seconds at 220%, then a resist adapted for DUV, AZ® DX2034P made by Clariant Co. was coated thereon in a thickness of 0.75 micron after being prebaked at 90° C. for 60 seconds. After being exposed using a DUV stepper, EX10B, made by Nikon Co., they were baked at 105° C. for 90 seconds, then developed in a 2.38% TMAH solution. Observation under SEM (scanning type electron microscope) of the thus obtained resist patterns revealed that every sample suffered no standing wave due to reflection from the substrate and formed no mutually dissolved layer with the resist layer. Thus, good resist pattern was obtained.

ADVANTAGES OF THE INVENTION

As has been described hereinbefore, the composition of the present invention for forming a radiation absorbing coating enables one to form a resist image which undergoes no intermixing between the radiation absorbing coating and the resist layer, no diffusion and invasion of an acid formed in the resist layer upon exposure into the resist layer, no footing and formation of no scum. The composition can form a radiation absorbing coating such as an anti-reflective coating having high performance and being easy to handle.

INDUSTRIAL UTILITY

As has been described hereinbefore, the composition of the present invention for forming a radiation absorbing coating is useful as a material for forming an anti-reflective coating on a substrate in manufacturing integrated circuit elements.

What is claimed is:

1. A composition for forming a radiation absorbing coating, which comprises a radiation absorbing material and a compound having two or more blocked isocyanate groups, the compound being distinct from the radiation absorbing material, wherein the compound having blocked isocyanate groups is a compound having bis-isocyanate groups blocked with alcohols, and is represented by the general formula (I):

$$R^1OOCHN-X-NHCOOR^2 \qquad (I)$$

wherein X represents a straight-chain or branched alkylene group containing 1 to 30 carbon atoms, a divalent alicyclic hydrocarbon group containing 3 to 30 carbon atoms or a divalent aromatic ring group containing 4 to 30 carbon atoms, and $R^1$ and $R^2$ each independently represents an alkyl group containing 1 to 20 carbon atoms.

2. The composition of claim 1, further comprising at least one of a thermal- or photo-acid generator, an aliphatic sulfonic acid or a salt thereof, an aromatic sulfonic acid or a salt thereof, and a crosslinking agent comprising a melamine derivative or an ethylene-urea derivative.

* * * * *